United States Patent [19]
Takemura et al.

[11] Patent Number: 5,786,242
[45] Date of Patent: Jul. 28, 1998

[54] METHOD OF MANUFACTURING SOI SEMICONDUCTOR INTEGRATED CIRCUIT

[75] Inventors: Yasuhiko Takemura, Kanagawa; Shunpei Yamazaki, Tokyo, both of Japan

[73] Assignee: Semiconductor Energy Laboratory Co., Ltd., Kanagawa, Japan

[21] Appl. No.: 561,184

[22] Filed: Nov. 21, 1995

[30] Foreign Application Priority Data

Nov. 25, 1994 [JP] Japan .................................. 6-315635

[51] Int. Cl.$^6$ .................................................. H01L 21/336
[52] U.S. Cl. .............................. 438/166; 438/459; 216/66
[58] Field of Search ............................ 437/21, 974, 225, 437/40 TFT, 41 TFT; 156/643.1, 646.1, 662.1; 216/58, 63, 66, 79, 80; 438/166, 455, 459, 485, 486, 487, 488, 690

[56] References Cited

U.S. PATENT DOCUMENTS

| | | | |
|---|---|---|---|
| 4,310,380 | 1/1982 | Flamm et al. | 156/643.1 |
| 4,498,953 | 2/1985 | Cook et al. | 156/646.1 |
| 4,980,308 | 12/1990 | Hayashi et al. | 437/974 |
| 5,089,441 | 2/1992 | Moslehi | 437/225 |
| 5,326,406 | 7/1994 | Kaneko et al. | 134/1 |
| 5,350,480 | 9/1994 | Gray | 156/345 |
| 5,403,434 | 4/1995 | Moslehi | 156/643 |
| 5,427,052 | 6/1995 | Ohta et al. | 437/225 |
| 5,441,594 | 8/1995 | Zenke | 156/643.1 |
| 5,534,107 | 7/1996 | Gray et al. | 156/643.1 |
| 5,589,419 | 12/1996 | Ochiai | 437/974 |
| 5,641,380 | 6/1997 | Yamazaki et al. | 438/304 |

OTHER PUBLICATIONS

Ibbotson et al., "Plasmaless Dry Etching of Silicon With Fluorine-Containing Compounds", J. Appl. Phys. vol. 56, No. 10, 15 Nov. 1984, pp. 2939–2942.
Saito et al., "Plasmaless Etching of Silicon Using Chlorine Trifluoride", J. Vac. Sci. Technol. B, vol. 9, No. 5, Sep./Oct. 1991, pp. 2503–2506.

Primary Examiner—Mary Wilczewski
Attorney, Agent, or Firm—Sixbey, Friedman, Leedom & Ferguson, P.C.; Gerald J. Ferguson, Jr.

[57] ABSTRACT

It is intended to provide a method for forming a semiconductor integrated circuit using single crystal silicon on an inexpensive substrate such as glass. An insulating layer mainly made of silicon oxide and having a seed opening is provided on a single crystal silicon wafer, and a non-single-crystal silicon film is deposited thereon. The non-single-crystal silicon film is melted starting from the seed opening by scanning it with, for instance, a strip heater, and thereby converted into a substantially single-crystalline silicon film. After a device is formed by using the thus-produced single crystal film, an insulative substrate such as a glass substrate is bonded to the device surface. Then, the silicon substrate is etched by leaving it in an atmosphere of a halogen fluoride such as $ClF_3$ in a non-plasmic state. Before the etching with a halogen fluoride, the silicon substrate may be polished to a thickness of 10 to 100 μm. Having a large selective etching ratio of silicon to silicon oxide, a halogen fluoride etches only silicon, i.e., hardly etches silicon oxide. Therefore, there does not occur a case that silicon oxide layer is overetched to destroy the device. Thus, an integrated circuit having better characteristics can be formed on an insulative substrate with a high yield.

20 Claims, 3 Drawing Sheets

METHOD OF MANUFACTURING SOI SEMICONDUCTOR INTEGRATED CIRCUIT

BACKGROUND OF THE INVENTION

1. Field of the Invention

The present invention relates to a manufacturing method of an SOI (silicon on insulator) semiconductor integrated circuit.

2. Description of the Related Art

In recent years, silicon semiconductor devices are required to operate at higher speed. To satisfy this requirement in a circuit that is formed on a silicon substrate in a conventional manner, parasitic capacitances between the substrate and circuit become an obstacle. To avoid this problem, the SOI integrated circuit has been developed which eliminates such parasitic capacitances by using a substrate made of an insulator.

The manufacturing method of the SOI integrated circuit is generally classified into two methods. In a first method, an amorphous silicon thin film is formed on a highly heat-resistant substrate made of such a material as sapphire, spinel, and quartz, and then crystallized by thermal annealing, for instance. A circuit is formed by using a resulting silicon film. By using substrate materials, such as sapphire, spinel, or the like, whose crystal structure and lattice constants are similar to those of a silicon crystal, heteroepitaxial growth occurs in an amorphous silicon film, to produce a single crystal film. However, it is difficult to bring this manufacturing method into a mass-production stage because sapphire and spinel substrates are expensive and cannot be formed into a large-area substrate. Although a quartz substrate is less expensive than sapphire and spinel substrates, it can provide only a polycrystalline film. Further, a least expensive glass substrate cannot withstand a high process temperature.

In a second method, after a semiconductor integrated circuit is formed on a single crystal silicon substrate, the device surface is bonded to an insulative substrate and the single crystal silicon substrate is thinned from its back side by mechanical polishing or dry etching. Since a device is fixed to an insulative substrate after completion of a device manufacturing process, this manufacturing method is almost free of problems resulting from the crystal structure and heat resistance of the insulative substrate, and can provide a substantially single-crystalline silicon device. (Refer to J. P. Salemo et al., SID International Symposium, Digest of Technical Papers, pp. 63–66, May 1992.)

According to the paper by J. P. Salemo et al., a silicon oxide layer having a partial opening (called "seed opening") and a polycrystalline silicon film are formed on a single crystal silicon substrate. By melting the polycrystalline silicon film by a zone melt method, the polycrystalline silicon film is converted into a single crystal film with the single crystalline silicon substrate used as a seed through the seed opening. The single crystal film can be used for device formation.

Since the silicon oxide layer is interposed between the device formation layer and the single crystal silicon substrate, the possibility is low that a device is destroyed when the single crystal silicon substrate is etched after the device top surface is bonded to an insulative substrate.

The SOI integrated circuit manufacturing method of J. P. Salemo et al. has not attained a sufficiently high mass-production yield because the largest problem exists in the step of thinning the single crystal silicon substrate.

In this manufacturing method, usually the thinning of the single crystal silicon substrate is performed in two stages. Mechanical polishing is performed first, and the remaining silicon substrate is etched by dry etching that uses plasma.

The largest problem in the dry etching is that the selective etching ratio of silicon to silicon oxide is as low as about 10. Where the thickness of a single crystal silicon substrate is 10 μm, for instance, asperity of about 3 μm will occur in the surface of the single crystal silicon substrate in its dry etching partly due to etching non-uniformity. Therefore, when the single crystal silicon substrate is completely removed by etching, the silicon oxide layer may be overetched as much as 0.5 μm at some locations. Since this overetching is a probabilistic phenomenon, the silicon oxide layer may be etched by more than 1 μm at a certain location. This overetching may cause a failure of the entire circuit.

To avoid the overetching, one of the following two methods needs to be employed. A first method is to thin the single crystal silicon substrate to less than 10 μm by polishing it before the dry etching step. A second method is to make the silicon oxide layer thicker than 2 μm. However, in the first method, there is a high possibility that the device is mechanically damaged. The second method has a problem that the silicon oxide layer is more likely peeled from the single crystal silicon substrate. Further, if this device is used in, for instance, a peripheral circuit of a liquid crystal display, in which case the distance from an opposed electrode becomes longer, there occur problems in device operation.

Further, as the single crystal silicon substrate is thinned, the insulation performance of the substrate is enhanced and the possibility of electrostatic breakdown due to charge up is thereby increased.

SUMMARY OF THE INVENTION

The present invention has been made in view of the above problems, and therefore has an object to improve the production yield of an SOI integrated circuit by selectively etching a single crystal silicon substrate substantially without using plasma.

According to the invention, the above problems are solved by etching a single crystal silicon substrate in an atmosphere containing a halogen fluoride, i.e., a substance that is represented by a chemical formula $XF_n$ (X is a halogen other than fluorine and n is an integer) such as ClF, $ClF_3$, BrF, $BrF_3$, IF or $IF_3$.

That is, according to the invention, there is provided a manufacturing method of an SOI semiconductor integrated circuit, comprising the steps of:

(1) forming a layer mainly made of silicon oxide on a single crystal silicon substrate;

(2) forming a non-single-crystal silicon coating on the silicon oxide layer;

(3) crystallizing the non-single-crystal silicon coating by using the single crystal silicon substrate as a seed;

(4) forming a semiconductor integrated circuit by using a crystallized silicon film obtained in step (3);

(5) bonding an insulative substrate to a top surface of the semiconductor integrated circuit; and (6) etching the single crystal silicon substrate by leaving the single crystal silicon substrate in a non-plasmatic atmosphere containing a halogen fluoride.

The above manufacturing method of an SOI semiconductor integrated circuit is characterized in that silicon is etched with a halogen fluoride in a non-plasmic state.

A halogen fluoride in a non-plasmic state has a feature of etching silicon but not etching silicon oxide at all. Therefore, the silicon oxide layer on the single crystal silicon substrate is not overetched in the dry etching of silicon. This prevents the device from being damaged.

Further, it is not necessary to polish the single crystal silicon substrate to avoid overetching of the silicon oxide layer. That is, an SOI semiconductor integrated circuit can be obtained in which the single crystal silicon substrate is thinned only by etching with a halogen fluoride.

A step of thinning the single crystal silicon substrate by polishing may be inserted between steps (4) and (5) of the above process. In this step, it is sufficient to thin the single crystal silicon substrate to a thickness of 10 to 100 µm. In contrast to the conventional process, it is not necessary to thin the single crystal silicon substrate to less than 10 µm. This prevents destruction of the device during the polishing.

In step (3) of the above process, the silicon oxide layer does not occupy a seed opening. A process of oxidizing a portion of the crystallized silicon film occupying the seed opening may be inserted between steps (3) and (4). By forming silicon oxide in the seed opening, the etching does not proceed to the upper layer, thus contributing to increase of the yield.

In the present invention, the insulative substrate may be made of various materials such as no-alkali borosilicate glass (typically, Corning 7059), no-alkali alumina silicate glass (typically, Corning 1737), and a variety of plastics. Teflon-type materials are not etched with a halogen fluoride, but may be etched with some other materials. Therefore, it is preferred that the surface be coated with silicon oxide or Teflon.

The etching with a halogen fluoride has a feature that it proceeds faster in a surface being illuminated with light (ultraviolet light or laser light). Therefore, the etching time can be shortened by applying light from the side of the single crystal silicon substrate. As a result, damage to the insulative substrate can be reduced. The similar effect can be obtained by applying an ion or electron beam.

DESCRIPTION OF THE PREFERRED EMBODIMENT

An embodiment of the present invention will be described with reference to FIGS. 1A to 1D, 2(A) to 2(C), and 3.

Figure 2A:
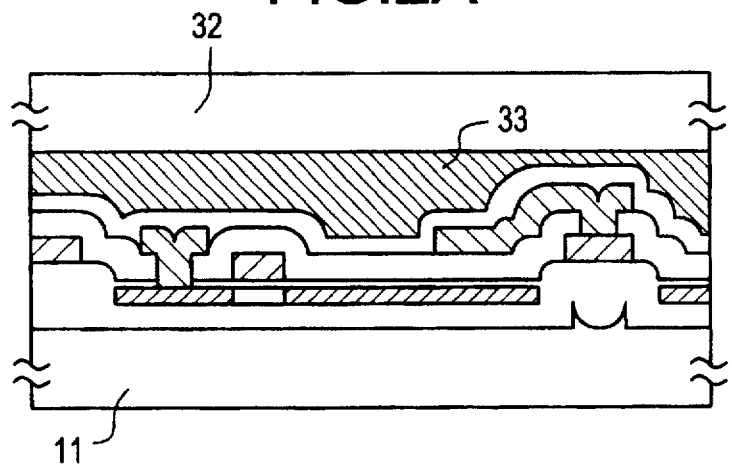
FIGS. 2A to 2C are sectional views showing an SOI forming process for forming an SOI integrated circuit.
Figure 2B:
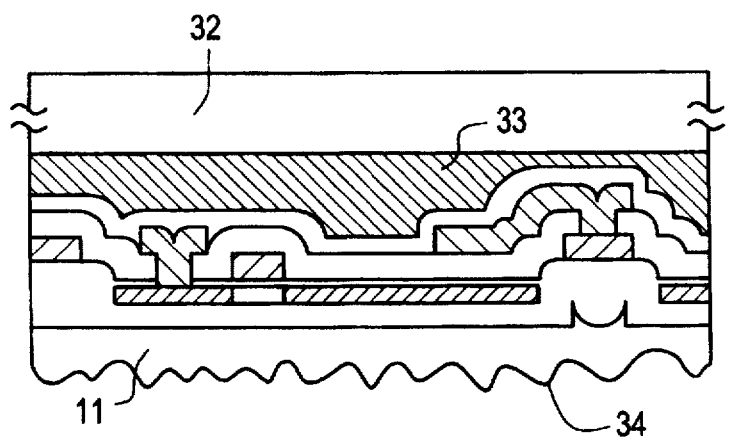
Figure 2C:
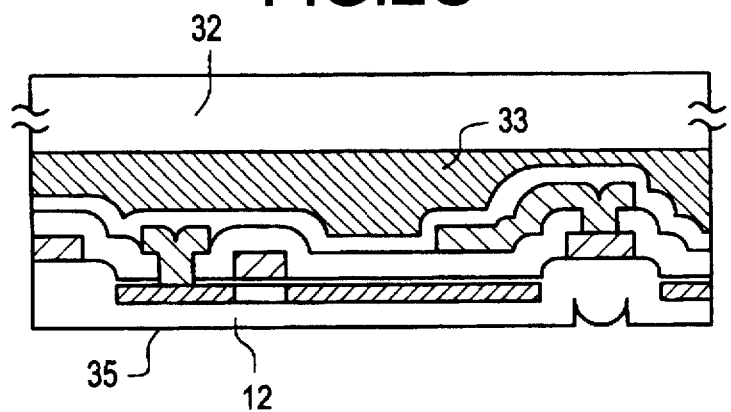
Figure 3:
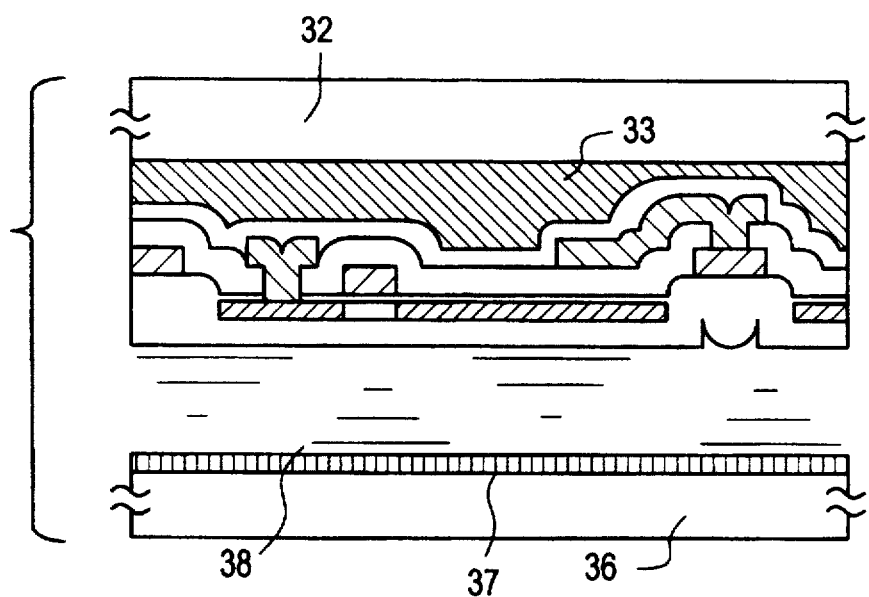
FIG. 3 is a sectional view of a liquid crystal display.

This embodiment is directed to an active matrix for a liquid crystal display which active matrix is produced by using an SOI semiconductor integrated circuit. FIGS. 1A to 1D are sectional views showing a wafer process that is performed on a single crystal silicon substrate. FIGS. 2A to 2C are sectional views showing an SOI forming process. FIG. 3 is a sectional view of a completed liquid crystal display.

Figure 1A:
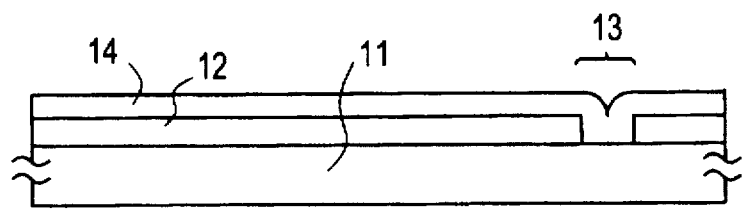
FIGS. 1A to 1D are sectional views showing a wafer process for forming a semiconductor integrated circuit according to an embodiment of the present invention.

In the wafer process, as shown in FIG. 1A, first a silicon oxide film 12 of 2,000 to 5,000 Å in thickness is deposited on a 0.3-mm thick single crystal substrate 11 by thermal CVD. A seed opening 13 is formed in the silicon oxide film 12. Further, a polycrystalline silicon film 14 of 300 to 1,000 Å in thickness is deposited on the silicon oxide film 12 by thermal CVD.

Figure 1B:
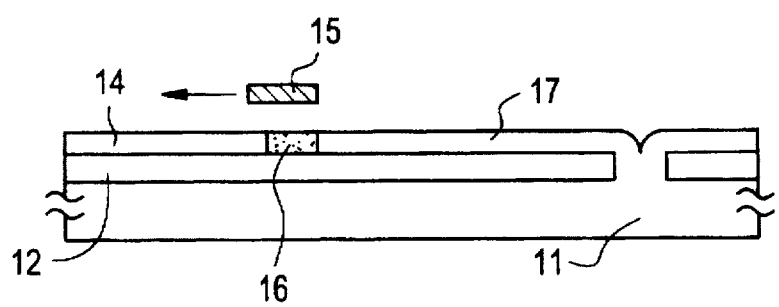

Subsequently, the polycrystalline silicon film 14 is heated and melted by a strip heater 15 while the strip heater 15 is moved starting from the seed opening 13. Therefore, the single crystal silicon substrate 11 is melted first in the seed opening 13 and a molten silicon region 16 is formed there. The molten silicon region 16 moves with the movement of the strip heater 15. The movement of the molten silicon region 16 means that silicon is crystallized by being melted and then solidified. As a result, a substantially single-crystalline silicon film 17 is formed with the single crystal silicon substrate 11 as a seed. "Substantially single-crystalline" means that a crystal can be regarded as a single crystal when viewed macroscopically over a range of a more than 10 µm diameter in spite of the existence of stacking faults. (FIG. 1B)

Figure 1C:
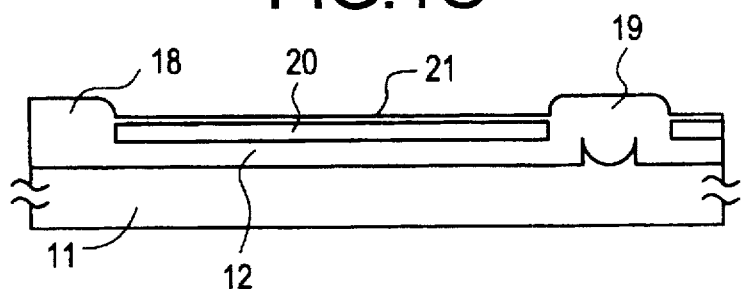

Insulating portions 18 and 19 for device separation are formed by subjecting the silicon film 17 to selective thermal oxidation by the known LOCOS method. The selective thermal oxidation is so performed that silicon is completely oxidized in the seed opening 13. Thus, the single crystal silicon film 17 and the single crystal silicon substrate 11 are separated from each other by the silicon oxide portion 19. Thereafter, a gate insulating film 21 is formed by thermal oxidation. With the above process, a silicon region 20 is formed which is separated from the other portions. (FIG. 1C)

Then, a semiconductor integrated circuit is formed by the known semiconductor integrated circuit manufacturing technology. In this embodiment, an active matrix circuit for a liquid crystal display is formed.

Figure 1D:
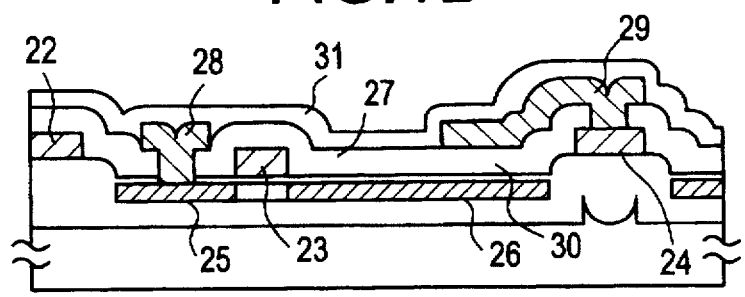

First, a polycrystalline silicon film is deposited on the gate insulating film 21, and then patterned into a gate electrode/wiring lines 22 to 24. A source 25 and a drain 26 are formed by implanting ions into the silicon region 20 with the gate electrode/wiring lines 22 to 24 used as a mask, and re-crystallizing it by thermal annealing. An interlayer insulating film 27 is then deposited. After contact holes are formed therein, a source electrode/wiring line 28 and a holding capacitor electrode/wiring line 29 are formed. Finally, a silicon nitride passivation film 31 is deposited. Thus, an active matrix circuit is obtained. In this state, a capacitor having the interlayer insulating film 27 and the gate insulating film 21 as dielectric films are formed in a region 30 that is located between the drain 26 and the holding capacitor electrode/wiring line 29. (FIG. 1D)

Thus, the wafer process is completed. The application of the wafer process of the invention is not limited to the simple structure shown in FIGS. 1A to 1D, but may include various circuits having structures different than the circuit of FIGS. 1A to 1D. For example, not only an active matrix circuit, but also a peripheral driving circuit for the active matrix circuit and a high-grade information processing circuit may be formed. In the latter case, the display is given more added value.

In the next stage, a glass substrate (Corning 7059) 32 is bonded to the device top surface by using an epoxy resin as an adhesive/sealing agent 33. (FIG. 2A)

Subsequently, etching is performed with $ClF_3$. First, the substrate 11 is placed in a quartz tube so as to be erected. The quartz tube is exhausted to 1 to 10 Torr, and a mixed gas of nitrogen and $ClF_3$ is introduced. Etching is started in this state. The flow rate of each of nitrogen and $ClF_3$ is set at 500 sccm. By maintaining this state for 50 hours, the single crystal silicon substrate 11 is completely etched. It was observed that in an intermediate state of the etching (the etched had proceeded to an extent of about 0.2 mm), an etched surface 34 of the single crystal silicon substrate 11 had large asperity of 20 μm at the maximum, which is equivalent to asperity produced by the ordinary dry etching. FIG. 2B)

However, a very flat surface 35 is obtained when the etching completed, because the etching is stopped at the surface of the silicon oxide layer 12 at any points. Although the etching step takes as long as 50 hours, this does not cause a reduction of productivity, because a large number of substrates can be processed at the same time. An active-matrix-side substrate is produced in the above manner. To protect transistors, a passivation film of silicon nitride, for instance, may additionally be formed on the silicon oxide layer 12. (FIG. 2C)

Thereafter, a 1,000-Å-thick ITO (indium tin oxide) film 37 is formed on a glass substrate (Corning 7059) 36 that is to serve as an opposed substrate. After the glass substrates 32 and 36 are subjected to a rubbing treatment, they are opposed to each other. A liquid crystal 38 is injected between the glass substrates 32 and 36, to complete a liquid crystal display.

In this embodiment, the drain 26 itself of the transistor is used as a pixel electrode of the active-matrix-side substrate. This utilizes the fact that a very thin, single crystal silicon film is optically transparent. (FIG. 3)

In this embodiment, the distance between the pixel electrode (i.e., drain 26) on the active matrix side and the liquid crystal is equal to the thickness 2,000 to 5,000 Å of the silicon oxide layer 12 or that thickness plus the thickness of the silicon nitride passivation film. Such a distance does not cause any problem in the driving of the liquid crystal.

The present invention allows the SOI semiconductor integrated circuits to be produced at a high yield. In particular, the invention can increase not only the production yield of circuits but also the reliability, because plasma is not used in etching the single crystal silicon substrate. Although in the above embodiment the active matrix circuit is used as an example of the semiconductor integrated circuit, a memory circuit, a CPU, etc. can also be produced according to the invention. Thus, the invention is very useful from the industrial point of view.

What is claimed is:

1. A method of manufacturing an SOI semiconductor integrated circuit comprising the steps of:
   (1) forming a layer comprising silicon oxide on a single crystal silicon substrate;
   (2) forming a non-single-crystal silicon coating on the silicon oxide layer;
   (3) crystallizing the non-single-crystal silicon coating by using the single crystal silicon substrate as a seed;
   (4) forming a semiconductor integrated circuit by using the crystallized silicon coating obtained in step (3);
   (5) bonding an insulating substrate to a top surface of the semiconductor integrated circuit; and
   (6) completely etching the single crystal silicon substrate by leaving the single crystal silicon substrate in a non-plasmatic atmosphere containing a halogen fluoride.

2. The method according to claim 1 wherein the halogen fluoride is one selected from the group consisting of ClF, ClF$_3$, BrF, BrF$_3$, IF and IF$_3$.

3. The method according to claim 1 further comprising, between steps (4) and (5), the step of thinning the single crystal silicon substrate to a thickness of 10 to 100 μm by polishing it.

4. The method according to claim 1 further comprising, between steps (3) and (4), oxidizing a portion of the crystallized silicon coating occupying a seed opening.

5. The method of claim 1 wherein the layer comprising oxide has an opening therein.

6. The method of claim 5 wherein the non-single crystal silicon coating is formed in contact with the single crystal silicon substrate through the opening.

7. The method of claim 1 wherein the single crystal silicon substrate is left in the non-plasmatic atmosphere containing the halogen fluoride with the single crystal silicon substrate being irradiated with a light, an ion or an electron beam.

8. The method of claim 1 wherein the single crystal silicon substrate is left in the non-plasmatic atmosphere containing the halogen fluoride with the single crystal silicon substrate being irradiated with an ultraviolet light or a laser light.

9. The method of claim 1 wherein the layer comprising silicon oxide is formed to a thickness of 2000 to 5000 Å.

10. The method of claim 1 wherein the formation of the layer comprising silicon oxide is carried out by thermal CVD.

11. The method of claim 1 wherein the insulating substrate is bonded to the top surface of the semiconductor integrated circuit with an adhesive comprising an epoxy resin.

12. A method of manufacturing an SOI semiconductor integrated circuit comprising the steps of:
   (1) forming a layer comprising silicon oxide on a single crystal silicon substrate;
   (2) forming a semiconductor integrated circuit on the layer comprising silicon oxide;
   (3) bonding an insulating substrate to a top surface of the semiconductor integrated circuit; and
   (4) completely etching the single crystal silicon substrate by leaving the single crystal silicon substrate in a non-plasmatic atmosphere containing a halogen fluoride.

13. The method according to claim 12 wherein the halogen fluoride is one selected from the group consisting of ClF, ClF$_3$, BrF, BrF$_3$, IF and IF$_3$.

14. The method according to claim 12 further comprising, between steps (2) and (3), the step of thinning the single crystal silicon substrate to a thickness of 10 to 100 μm by polishing it.

15. The method of claim 12 wherein the single crystal silicon substrate is left in the non-plasmatic atmosphere containing the halogen fluoride with the single crystal silicon substrate being irradiated with a light, an ion or an electron beam.

16. The method of claim 12 wherein the single crystal silicon substrate is left in the non-plasmatic atmosphere containing the halogen fluoride with the single crystal silicon substrate being irradiated with an ultraviolet light or a laser light.

17. The method of claim 12 wherein the layer comprising silicon oxide is formed to a thickness of 2000 to 5000 Å.

18. The method of claim 12 wherein the formation of the layer comprising silicon oxide is carried out by thermal CVD.

19. The method of claim 12 wherein the insulating substrate is bonded to the top surface of the semiconductor integrated circuit with an adhesive comprising an epoxy resin.

20. The method of claim 12 wherein the insulating substrate comprises a glass.

* * * * *